United States Patent [19]
Zhou

[11] Patent Number: 6,057,685
[45] Date of Patent: May 2, 2000

[54] METHOD FOR CORRECTING MOTION-INDUCED ERRORS IN MR IMAGING

[75] Inventor: Xiaohong Zhou, Pewaukee, Wis.

[73] Assignee: General Electric Company, Milwaukee, Wis.

[21] Appl. No.: 08/987,594

[22] Filed: Dec. 9, 1997

[51] Int. Cl.[7] .................................................. G01V 3/00
[52] U.S. Cl. ......................... 324/306; 324/309; 600/410; 600/534
[58] Field of Search ................................... 324/309, 306, 324/307, 312; 600/410, 534, 419

[56] References Cited

U.S. PATENT DOCUMENTS

| 115,812 | 5/1871 | Sano et al. | 128/653.2 |
| 4,937,526 | 6/1990 | Ehman et al. | 324/309 |
| 5,226,418 | 7/1993 | Bernatein et al. | 128/653.3 |
| 5,329,925 | 7/1994 | Nessavier | 128/653.2 |

*Primary Examiner*—Christine K. Oda
*Assistant Examiner*—Brij B. Shrivastav
*Attorney, Agent, or Firm*—James O Skarsten; Christian G. Cabou; Phyllis Y. Price

[57] ABSTRACT

In a method for providing an MR image of a section taken through an object, wherein the section is acquired in the presence of in-plane translational motion of the object, an MR system is operated to acquire a set of imaging data points from the section, the set of imaging data points being contaminated by phase errors resulting from the motion. The MR system is further operated to acquire a plurality of correction data point sets, each correction data point in one of said sets being acquired along an alignment line or other trajectory and at a location coinciding with the location of one of the imaging data points. The imaging data points respectively coinciding with the correction data points comprise, collectively, a subset of the imaging data points. The phase difference between each correction data point set and its corresponding subset of imaging data points is determined, and then used to remove the phase errors from the set of imaging data points.

16 Claims, 5 Drawing Sheets

METHOD FOR CORRECTING MOTION-INDUCED ERRORS IN MR IMAGING

BACKGROUND OF THE INVENTION

The invention disclosed and claimed herein is generally directed to a method for correcting errors which contaminate, or are contained in, magnetic resonance imaging (MRI) data, and which result from translational motion in a patient or other object of imaging. More particularly, the invention pertains to a correction method of the above type which employs sets of correction data points that are acquired very rapidly so as to be substantially unaffected by the motion. Even more particularly, the invention pertains to a correction method of the above type wherein the correction data are acquired at some of the same data point locations as the imaging data.

In conventional MRI, the scan time typically lasts a few seconds to several minutes. During this time, physiologic motion (e.g., cardiac, respiratory, gastrointestinal, and vascular motion), as well as a patient's gross movements (both voluntary and involuntary) can contaminate the spatially encoded MR signals, causing ghosting and blurring artifacts. Some of these motions, such as cardiac, respiratory and vascular motion, or blood flow, are periodic in nature. Other motions, such as involuntary motion of a patient, or uncontrolled movements of small children, are non-periodic and thus tend to be random or unpredictable.

In a conventional imaging technique such as spin warp, k-space is sampled by a series of lines parallel to the frequency-encoding axis ($k_x$-axis), with each line corresponding to a unique location along the phase-encoding axis ($k_y$-axis). Typically, each $k_x$-line is acquired with a single pulse sequence. The acquisition time lasts only a few milliseconds. Motion during this short acquisition time, known as intra-view motion, is negligible and does not cause substantial image degradation. However, different k-space lines along the phase-encoding direction are acquired by repeating the pulse sequence with different phase-encoding gradients. The time span among the k-space lines can be hundreds of milliseconds or even seconds, making the k-space data along the phase-encoding direction very susceptible to motion. Such motion, referred to as view-to-view motion, can cause serious artifacts in images.

In the past, two principal techniques have been used to correct, or to provide compensation for motion. In one of such techniques, known as gating, data acquisition is synchronized with the motion. Such technique is discussed, for example, by W. J. Rogers, Jr., and E. P. Shapiro in "Effect of RR interval variation on image quality in gated, two-dimensional, Fourier MR imaging", Radiology, vol. 186, pp. 883–887 (1993). However, the gating technique can only be used in connection with motion which is periodic. Moreover, such technique will significantly slow down data acquisition if the periods of successive motion cycles are comparatively long, e.g., on the order of seconds.

In another motion correction technique, known as navigator echo correction, an additional echo is acquired in the same pulse sequence that acquires the k-space data. This echo, referred to as navigator echo, is used to determine the instantaneous position of the object when the sequence is played out, and subsequently to correct the k-space data acquired by the same sequence. In a spin-warp pulse sequence, navigator echo correction doubles the total amount of data acquisition. In fast imaging sequences, such as multi-shot echo planar imaging (EPI) and multi-shot fast spin echo (FSE), navigator echo correction reduces the useable echo train length, which can lead to longer acquisition times. This technique is described, for example, by R. L. Ehman and J. P. Felmlee, Radiology, vol. 173, pp. 255–263 (1989), and by Z. W. Fu, et al., Magn. Reson. Med., vol. 34, pp. 746–753 (1995).

In view of the above disadvantages of the prior art, it would clearly be desirable to correct errors in MR imaging resulting from view-to-view motion, wherein the technique used for correction does not significantly increase data acquisition, and applies to motion which may be either periodic or non-periodic.

SUMMARY OF THE INVENTION

The invention is generally directed to a method for providing an MR image of a section taken through an object, which contains motion. The method more particularly includes a technique designed to correct errors resulting from translational motion occurring between different k-space lines along the phase-encoding direction.

In accordance with the method, an MR system is operated to acquire a set of k-space data points in the presence of view-to-view, translational motion along the readout (x-axis) and/or the phase-encoding (y-axis) directions. The data points are discretely sampled in parallel to the readout direction (i.e., at $k_{xm}$, where m=-(M-1)/2, -(M-3)/2, ..., (M-1)/2, and M is the total number of data points along the readout direction) at a fixed phase-encoding value, $k_{yn}$, and then repeated for different $k_{yn}$ values, where n=-(N-1)/2, -(N-3)/2, ..., (N-1)/2 (N is the total number of data points along the $k_y$ direction). The method further includes operating the MR system to rapidly acquire two or more k-space "alignment lines" parallel to the phase-encoding direction (i.e., the $k_y$-direction) before, during, or after the regular k-space data acquisition. The data points along the k-space alignment lines coincide with certain points that are sampled by the regular k-space lines parallel to the readout direction (i.e., the $k_x$-direction). The k-space alignment lines are acquired in a time interval which is sufficiently short, such as those acquired using a single-shot FSE sequence, so that the motion effect is negligible. The phases of the k-space signals along the alignment lines are compared to the phases of the corresponding regular k-space data at the same locations. From the phase differences, spatial shifts along the readout and the phase-encoding directions ($\Delta x_n$ and $\Delta y_n$, respectively) are calculated for each and every regular k-space line at different locations ($k_{yn}$) along the phase-encoding axis. Once the spatial shifts are determined, a phase correction comprising a constant phase and a linear phase along the readout direction is applied to each regular k-space line parallel to the readout axis. This correction removes the phase errors produced by the translational motion, resulting in a k-space data set free of motion defects.

In a useful embodiment, the k-space data points are acquired by means of a spin echo sequence. Each data point is identified by $k_{xm}$ and $k_{yn}$, which are locations in k-space along the frequency-encoding or $k_x$, axis and phase-encoding or $k_y$ axis, respectively. (m and n are the corresponding indices indicating the discrete nature of data.) For the nth view, each data point is contaminated by spatial errors or displacements $\Delta x_n$ and $\Delta y_n$, relative to a 2-D Cartesian reference resulting from the translational motion. Two sets of correction data points are acquired along respective linear trajectories parallel to the phase-encoding direction. Each correction data set comprises one of the alignment lines, referred to above. Respective correction data points are taken wherever the alignment lines intersect the ordinary k-space lines which are parallel to the readout direction. The correction data points are sampled by means of a rapid acquisition technique, such as echo planar imaging (EPI) or fast spin echo (FSE).

OBJECTS OF THE INVENTION

An object of the invention is to provide an improved method for correcting errors in acquired MR data, wherein the errors result from in-plane translational motion in the patient or other object of imaging.

Another object is to provide a method of the above type which does not significantly increase the data acquisition time.

Another object is to provide a method of the above type which is applicable to errors arising from both periodic and non-periodic motion.

These and other objects and advantages of the invention will become more readily apparent from the following description, taken together with the accompanying drawings.

DETAILED DESCRIPTION OF THE PREFERRED EMBODIMENT

Figure 1:
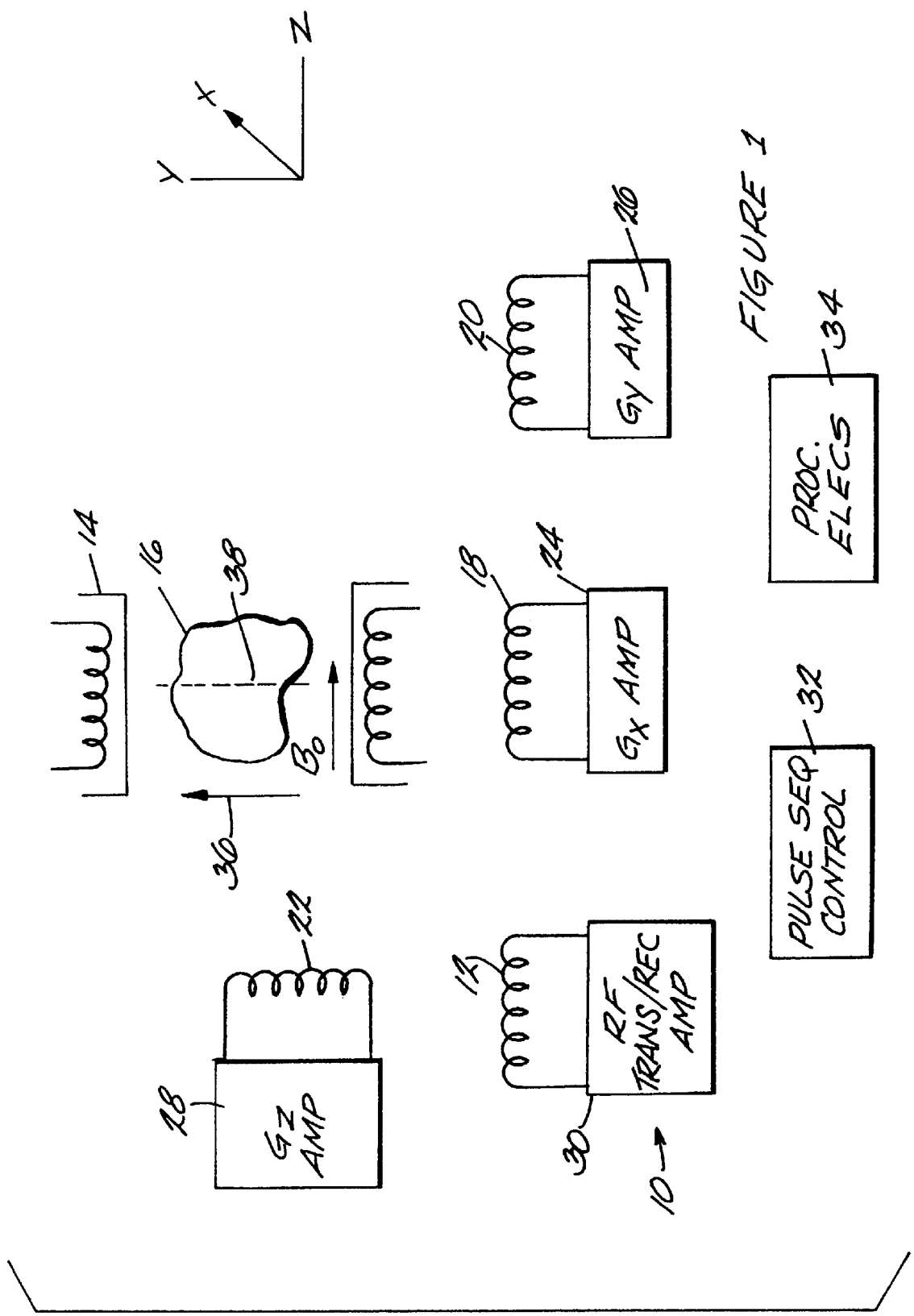
FIG. 1 is a schematic diagram showing basic components of an MR system for use in practicing an embodiment of the invention.

Referring to FIG. 1, there are shown the basic components of an MR system 10 which may be operated to acquire MR data, and to correct motion-induced errors in the data as described herein. System 10, in addition to an RF coil 12, includes a magnet 14 for generating a main or static magnetic field $B_0$, in the bore of a cylindrical magnet containing a patient or other imaging subject 16. System 10 further includes gradient coils 18, 20 and 22 for generating $G_x$, $G_y$, and $G_z$ magnetic field gradients relative to the orthogonal X-, Y- and Z-Cartesian reference axes, respectively. FIG. 1 shows each of the gradient coils 18, 20 and 22 respectively driven by amplifiers 24, 26 and 28, and RF coil 12 is coupled to transmit/receive amplifier 30. Referring further to FIG. 1, there is shown system 10 provided with a pulse sequence control 32, which is operated to control the RF and gradient amplifiers, and to thereby generate pulse sequences to produce and acquire sets of MR image data. System 10 also includes computation and processing electronics 34, for applying the method of the invention to correct errors in the acquired data, resulting from translational motion in the patient 16. FIG. 1 represents an example of such motion by means of an arrow 36, directed along the Y-axis. Electronics 34 employs the corrected acquired MR data to construct an image of the patient 16, taken in an imaging plane 38.

The construction, functions, and interrelationships of the respective components of MR System 10 described above are well known and described in the prior art in full detail, such as in U.S. Pat. No. 5,672,969, issued on Sep. 30, 1997 to Zhou et al.

As stated above, in conventional spin echo imaging, k-space is sampled by a series of lines parallel to the frequency-encoding or $k_x$ axis, with each line corresponding to a unique location along the phase-encoding or $k_y$ axis. The samples comprise a set of data, given by the following relation:

$$S(k_{xm},k_{yn}) = \int\int \rho(x,y) e^{-i(k_{xm}x+k_{yn}y)} dx dy \quad \text{Eqn. (1)}$$

In Equation (1), $\rho(x, y)$ is a two-dimensional image function, x and y are locations along the x- and y-logical axes of the MR system 10, and m and n are integers which indicate that k-space is sampled in a discrete fashion. (The logical axes can be, but are not necessarily, the physical X- and Y-reference axes of the system.)

As also stated above, acquisition of k-space data along the phase-encoding direction requires a significant amount of time. Accordingly, such data are likely to be contaminated or degraded by errors resulting from the translational motion in patient 16, referred to above. For example, using a receiver band width of ±25 kHz to digitize 256 k-space points, acquisition of a single $k_x$-line along the frequency-encoding direction is only 5 milliseconds. However, 256 of such lines are typically required along the phase-encoding direction, to provide all of the data needed for 2-D image reconstruction. Thus, acquisition time required for the entire image is on the order of seconds.

If $\Delta x_n$, and $\Delta y_n$ are the spatial displacements for the nth view in the readout and the phase-encoding directions, respectively, location along the x-axis is shifted to x', where $x'=(x-\Delta x_n)$. Similarly, location along the y-axis is shifted to y', where $y'=(y-\Delta y_n)$. Accordingly, the motion-contaminated k-space signal, that is, the signal affected by spatial displacement $\Delta x_n$ and $\Delta y_n$, becomes S'. S', comprising actually acquired MR data, is given by the following equation:

$$S'(k_{xm},k_{yn}) = \int\int \rho(x,y) e^{-i(k_{xm}x+k_{yn}y)} dx dy = e^{i(k_{xm}\Delta x_n + k_{yn}\Delta y_n)} S(k_{xm},k_{yn}) \quad \text{Eqn. (2)}$$

Spatial errors $\Delta x_n$ and $\Delta y_n$ are constant for the nth view. Thus, as shown by Eqn. (2), they can be taken out of the double integrals. The expression remaining within the double integrals is the expression for the uncontaminated or ideal signal S, given by Eqn. (1). Moreover, Eqn. (2) indicates that the effect of the spatial displacements $\Delta x_n$ and $\Delta y_n$ is to introduce two phase errors in each k-space line along the $k_x$-axis, i.e., a constant phase error $e^{ik_{yn}\Delta y_n}$, and a linear phase error $e^{ik_{xm}\Delta x_n}$. In accordance with the invention, if $\Delta x_n$ and $\Delta y_n$ can be determined for each view n, then the phase errors can be removed, and the ideal k-space signal $S(k_{xm}, k_{yn})$ can be recovered from S' ($k_{xm}$, $k_{yn}$).

Figure 2:
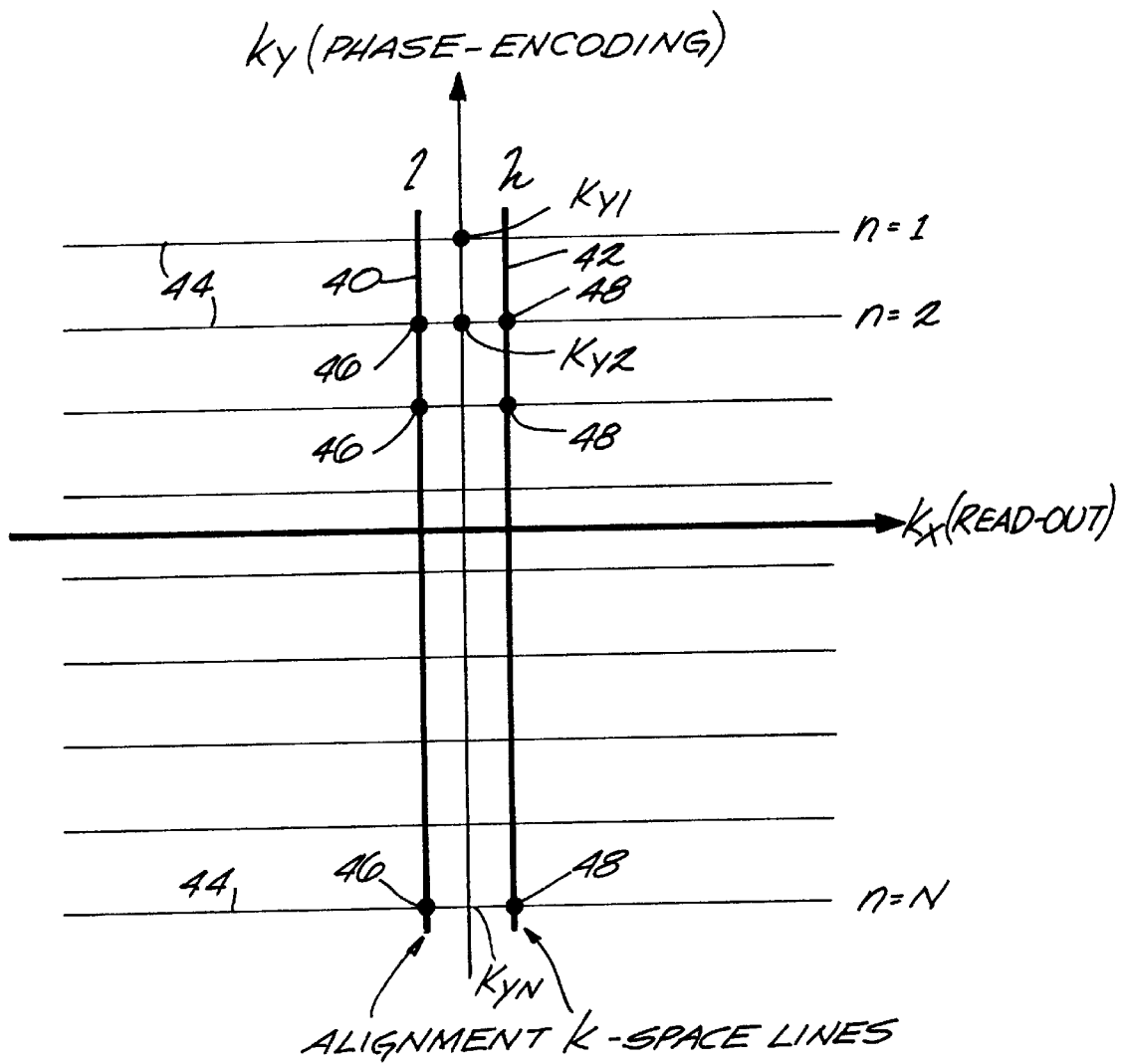
FIG. 2 is a schematic diagram useful for illustrating an embodiment of the invention.

In the method of the invention, two or more additional k-space lines, referred to as alignment lines, are rapidly acquired parallel to the phase-encoding or $k_y$ axis. More specifically, each alignment line comprises a set of MR data points or samples acquired along a linear trajectory which is parallel to the phase-encoding direction, and is located at a specified position along the readout or frequency-encoding axis. Respective data samples for each alignment line are taken wherever the line intersects the k-space lines which are parallel to the readout direction, and which comprise the lines of the ordinarily acquired image data. Thus, referring to FIG. 2, there are shown alignment lines 40 and 42, wherein the lines are located at $k_{xm}$ positions 1 and h, respectively, in relation to the readout axis $k_x$, and wherein both lines are parallel to the phase-encoding axis $k_y$. FIG. 2 further shows N k-space lines 44, parallel to the readout direction, which comprise the ordinary k-space data lines denoted by S' of Eqn. (2). The nth line 44 intersects the $k_y$ axis at $k_{yn}$.

Referring further to FIG. 2, there is shown line 40 intersecting each of the lines 44 at points 46, that is, at locations $k_{yn}$ along the phase-encoding axis. The set of MR data samples acquired at all such points, associated with alignment line 40, is usefully represented as an MR signal $S_l$ ($k_{yn}$). In like manner, FIG. 2 shows line 42 intersecting each of the lines 44 at points 48. The set of MR data samples acquired at all such points, associated with alignment line 42, is usefully represented as an MR signal $S_h$ ($k_{yn}$). It is seen that data points 46 and 48 coincide with, or are identical to, portions of the sample points employed in acquiring the ordinary k-space signal $S'(k_{xm}, k_{yn})$.

As stated above, the data sets $S_l(k_{yn})$ and $S_h(k_{yn})$ are very rapidly acquired. In particular, each such set is acquired during a narrow time window which is no greater than on the order of several milliseconds. Moreover, the total time required to acquire both sets can be less than on the order of a few tens of milliseconds. Because the acquisition time is so short, the effects of the translational motion on the alignment line data sets are negligible. Accordingly, such data sets, hereinafter referred to as correction data sets, are available for use in removing or correcting the motion induced errors in the acquired k-space data, as represented by Eqn. (2) above.

To acquire correction data sets $S_l$ and $S_h$ in a sufficiently short period of time, one of several conventional techniques may be employed. For example, a single-shot echo planar image (EPI) or a single-shot fast spin echo (FSE) with two or more echoes can be used. Alternatively, a gradient echo sequence with two phase-encoding gradients can be employed, as long as the two acquisitions are accomplished within a narrow time window during which motion is negligible. Even a regular spin-echo pulse sequence can be used to acquire the two alignment k-space lines, if the motion between two acquisitions can be held minimal.

To get a better signal-to-noise ratio, it is advantageous to place the alignment lines in the central k-space region. Thus, as shown in FIG. 2, alignment lines 40 and 42 are placed on opposite sides of the $k_y$ axis, with minimal phase-encoding values of opposite polarity.

The correction data sets $S_l$ and $S_h$ can be mathematically expressed as follows:

$$S_l(k_{yn}) = \int\int \rho(x,y) e^{-i(k_{xl}x + k_{yn}y)} dx dy \qquad \text{Eqn. (3)}$$

$$S_h(k_{yn}) = \int\int \rho(x,y) e^{-i(k_{xh}x + k_{yn}y)} dx dy \qquad \text{Eqn. (4)}$$

A subset of the data samples of the ordinary k-space signal S', taken at respective points 46 shown in FIG. 2, comprises a motion contaminated signal $S_l'(k_{yn})$. From Eqns. (2) and (3), $S_l'(k_{yn})$ can be represented as follows:

$$S_l'(k_{yn}) = e^{i(k_{xl}\Delta x_n + k_{yn}\Delta y_n)} S_l(k_{yn}) \qquad \text{Eqn. (5)}$$

Similarly, a subset of the data samples of the ordinary k-space signal $S'(k_{xm}, k_{yn})$, taken at respective points 48 shown in FIG. 2, comprises a motion-contaminated signal $S_h'(k_{yn})$, which can be represented as follows:

$$S_h'(k_{yn}) = e^{i(k_{xh}\Delta x_n + k_{yn}\Delta y_n)} S_h(k_{yn}) \qquad \text{Eqn. (6)}$$

From the above, and particularly from Eqn. (5), it is seen that the effect of spatial displacements $\Delta x_n$ and $\Delta y_n$ is to introduce a phase difference or phase error $\alpha_n$ between the motion correction signal $S_l(k_{yn})$ and the motion contaminated signal $S_l'(k_{yn})$ corresponding thereto. Such phase difference, from Eqn. (5), is given as follows:

$$\alpha_n = k_{xl}\Delta x_n + k_{yn}\Delta y_n \qquad \text{Eqn. (7)}$$

Since $S_l(k_{yn})$ and $S_l'(k_{yn})$ are acquired, the actual value of $\alpha_n$ can be derived as follows:

$$\alpha_n \equiv arg[S_l(k_{yn})/S_l'(k_{yn})] \qquad \text{Eqn. (8)}$$

In Eqn. (8), the symbol arg represents the operation to obtain the phase angle of the complex numbers within the brackets, which involves dividing one complex number by the other.

In like manner, the spatial displacements $\Delta x_n$ and $\Delta y_n$ introduce a phase difference $\beta_n$ between signals $S_h(k_{yn})$ and $S_h'(k_{yn})$, which is given by Eqn. (6) as follows:

$$\beta_n = k_{xh}\Delta x_n + k_{yn}\Delta y_n \qquad \text{Eqn. (9)}$$

The actual value of $\beta_n$ can be derived as follows:

$$\beta_n \equiv arg[S_h(k_{yn})/S_h'(k_{yn})] \qquad \text{Eqn. (10)}$$

Eqns. (7) and (9) provide two equations wherein, for a fixed or given value of view n, the only two unknowns are $\Delta x_n$ and $\Delta y_n$. From Eqns. (7) and (9), $\Delta x_n$ and $\Delta y_n$ can be obtained as follows:

$$\Delta x_n = [\alpha_n - \beta_n]/[k_{xl} - k_{xh}] \qquad \text{Eqn. (11)}$$

$$\Delta y_n = [\alpha_n - k_{xl}\Delta x_n]/k_{yn} \qquad \text{Eqn. (12)}$$

Since $k_{xl}$, $k_{xh}$, and $k_{yn}$ are all known, $\Delta x_n$ and $\Delta y_n$ can be readily obtained by solving Eqns. (11) and (12). Then, with known $\Delta x_n$ and $\Delta y_n$, the motion-free k-space signals $S(k_{xm}, k_{yn})$ can be recovered from the motion-contaminated signal $S'(k_{xm}, k_{yn})$, using Eqn. (2).

The alignment lines 40 and 42 can be acquired before, during or after the regular k-space acquisition. In general, if the alignment lines are acquired at time $t_0$, the motion corrected image will correspond to the instantaneous position of the object at the same time $t_0$. If multiple pairs of alignment lines are acquired at different times $t_0, t_1, t_2, \ldots t_p$, a series of motion corrected images can be reconstructed from the same original k-space data, each corresponding to a different time.

Although only two k-space alignment lines have been used to illustrate the motion correction method, more than two alignment lines can be employed for improved accuracy. When multiple k-space alignment lines are acquired, $\Delta x_n$ and $\Delta y_n$ can be calculated from Eqn. (13):

$$\begin{bmatrix} \alpha_n \\ \beta_n \\ \ldots \\ \omega_n \end{bmatrix} = \begin{bmatrix} k_{xl} & k_{yn} \\ k_{xh} & k_{yn} \\ \ldots \\ k_{xz} & k_{yn} \end{bmatrix} \begin{bmatrix} \Delta x_n \\ \Delta y_n \end{bmatrix}, \qquad \text{Eqn. (13)}$$

where $\alpha_n, \beta_n, \ldots, \omega_n$ are the phase differences between the k-space alignment lines l, h, ... z and the corresponding regular k-space data points, respectively. Obtaining $\Delta x_n$ and $\Delta y_n$ from Eqn. (13) is equivalent to performing a least-squares fitting from which the slope gives $\Delta x_n$ and the intercept yields $\Delta y_n$.

It is to be noted that the phase difference calculation can be adversely affected by noise in the regions where the magnitudes of the k-space data are small. This problem can be circumvented by setting a threshold of the k-space magnitude below which the phase difference is not calculated. The missing $\Delta x_n$ and $\Delta y_n$ resulting from the missing phase differences can be either set to zero or interpolated based on the values from the nearest neighbors.

Figure 3:
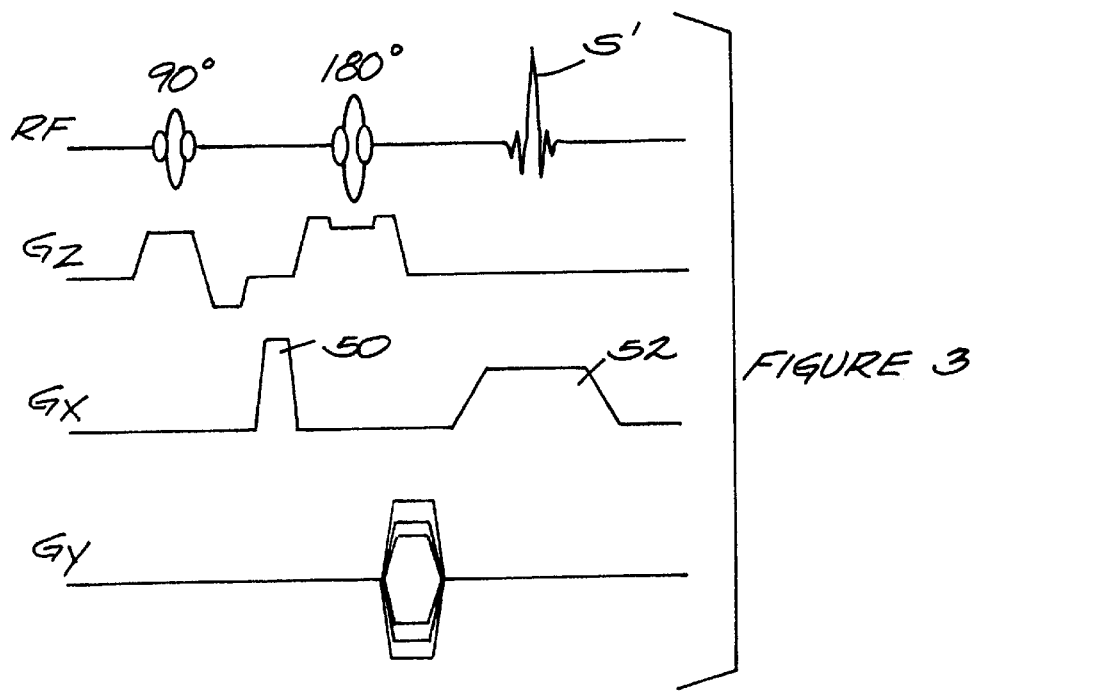
FIGS. 3 and 4 are pulse sequence diagrams showing respective RF and gradient wave forms for implementing the embodiment of FIG. 2.

Referring to FIG. 3, there are shown RF and gradient wave forms, generated in accordance with a conventional spin-warp technique, which may be implemented to acquire the ordinary k-space signal S'($k_{xm}$,$k_{yn}$). The RF waveform comprises a 90° RF pulse, followed by a 180° refocusing pulse, to produce the MR signal S' ($k_{xm}$, $k_{yn}$). The $G_z$ gradient selects a slice or section, through an object of imaging, and the $G_x$ gradient produces a pulse 50, to provide a phase offset (or a pre-phaser) along the x-axis. The $G_x$ gradient also provides a readout pulse 52, coincidental with the signal S' ($k_{xm}$, $k_{yn}$). The amplitude of gradient field $G_y$ is varied during successive pulse sequences, to provide phase encoding along the $k_y$ direction.

It will be appreciated that the RF and gradient magnetic fields referred to above are typically applied to a patient 16 in the presence of a static $B_0$ field directed along the Z-axis. RF and $G_x$, $G_y$, and $G_z$ fields are usefully generated by coils such as coils 12, 18, 20 and 22, respectively, shown in FIG. 1.

Figure 4:
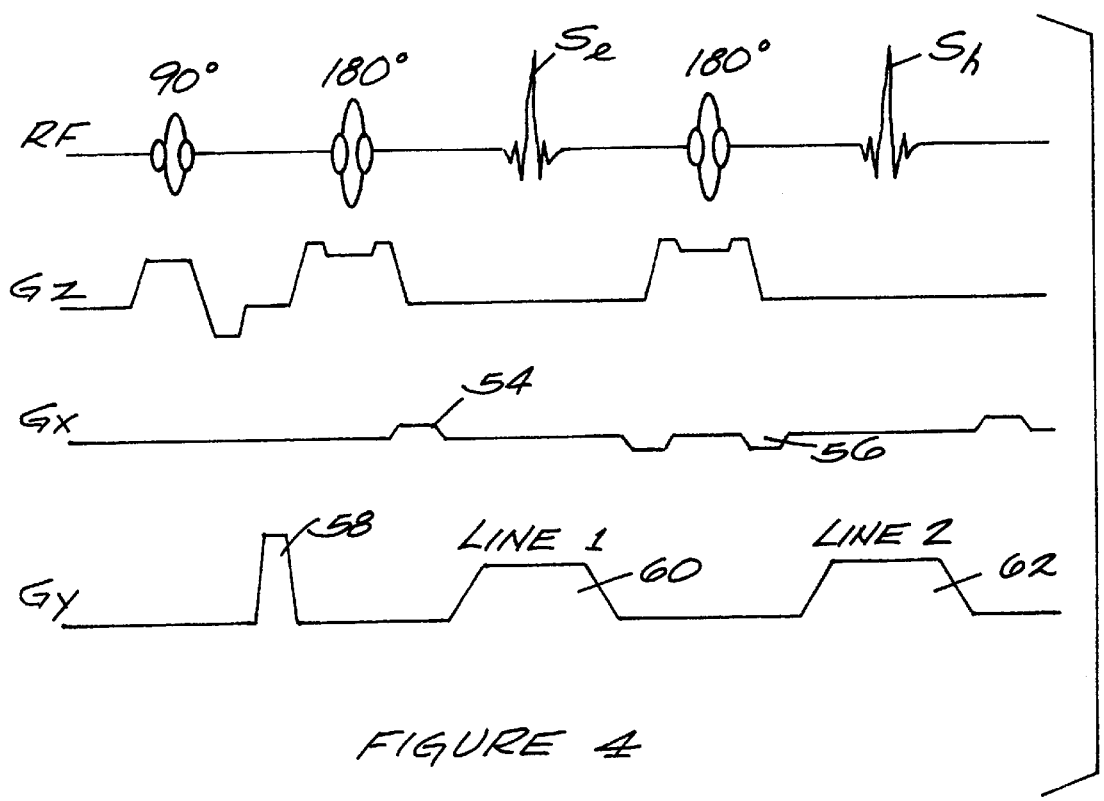

Referring to FIG. 4, there is shown a pulse sequence useful for acquiring the correction signals $S_l$ and $S_h$. The RF waveform comprises a 90° pulse followed by a first 180° refocusing pulse, which generates the MR correction signal $S_l$. Thereafter, a second 180° refocusing pulse occurs, which generates the MR correction signal $S_h$.

Referring further to FIG. 4, there is shown $G_z$ generating a slice-select pulse, along the z-axis. The $G_x$ gradient provides phase-encoding pulses 54 and 56, to select locations at k-space positions at l and h, respectively. The $G_y$ gradient provides a pre-phasing pulse 58 and readout pulses 60 and 62, in coincident relationship with signals $S_l$ and $S_h$, respectively.

Figure 5:
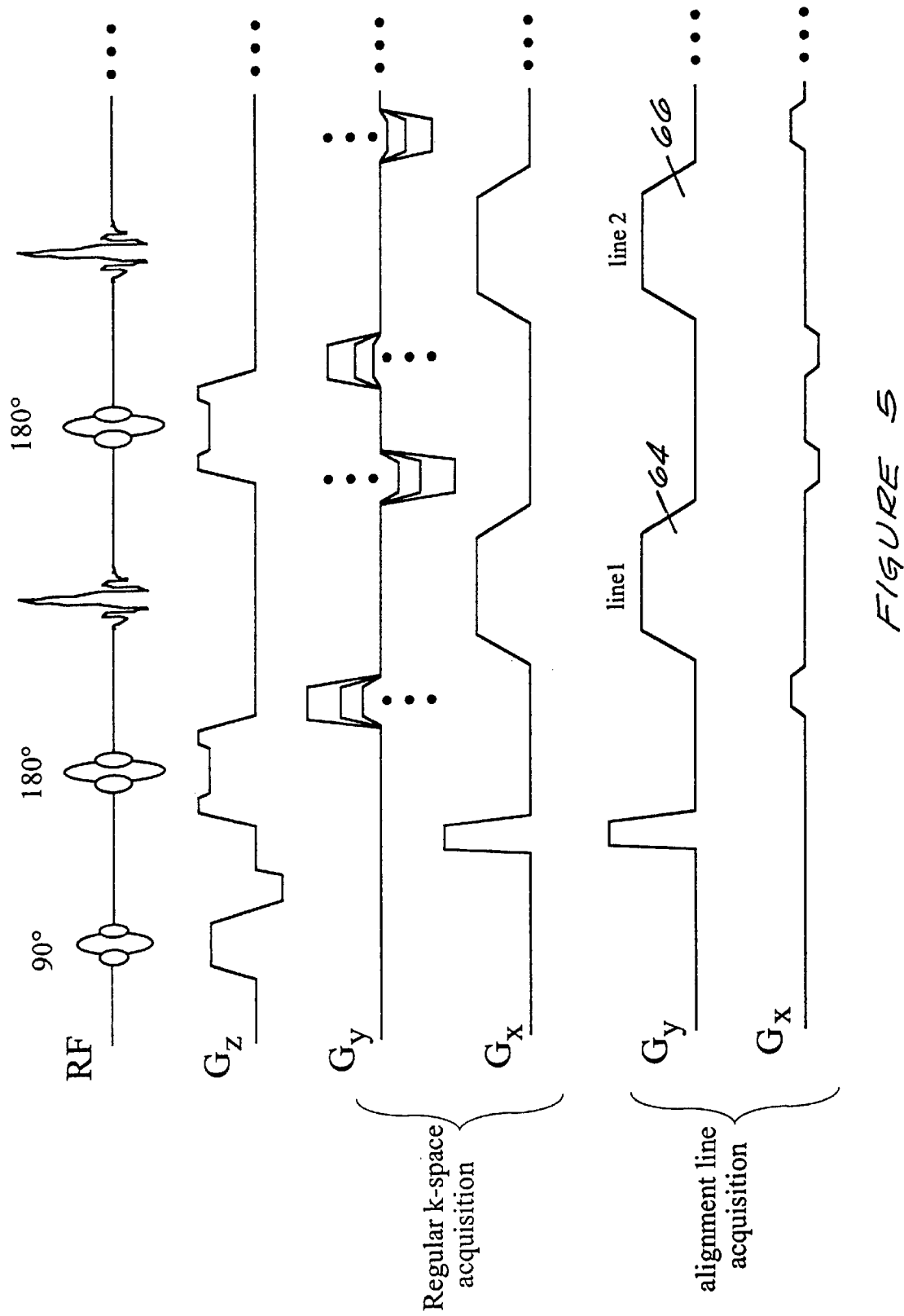
FIG. 5 is a pulse sequence diagram for implementing a modification of the embodiment of FIG. 2.

The correction method can also be incorporated into an FSE pulse sequence as shown in FIG. 5. The k-space alignment lines can be acquired before, during, or after the regular k-space data acquisition. For FSE, multiple k-space lines (e.g., 8 lines) are acquired in a single pulse sequence. Thus, the spatial shifts $\Delta x_n$ and $\Delta y_n$ calculated for one of the k-space views in the echo train can be applied to the other k-space views sampled by the other echoes of same echo train. This reduces the total number of $\Delta x_n$ and $\Delta y_n$ calculation by a factor equal to the echo train length. Since the central k-space region normally has higher signal-to-noise ratio, it is advantageous to use the echoes that traverse the central k-space region to calculate the shifts $\Delta x_n$ and $\Delta y_n$ and use these shifts to correct for the remaining k-space regions sampled by the other echoes in the same echo train. Although only two k-space alignment lines 64 and 66 are shown in FIG. 5, in principle, more alignment lines can be acquired for improved accuracy in estimating $\Delta x_n$ and $\Delta y_n$. In cases where phase inconsistency between even and odd echoes exist (the phase inconsistency can be caused by gradient field imperfections such as eddy currents), only odd or only even echoes may be used for calculating $\Delta x_n$ and $\Delta y_n$.

While the above embodiment is directed to using alignment lines which are parallel to the phase-encoding axis, other alignment k-space trajectories, such as oblique lines, circles and spirals may alternatively be used to calculate motion-induced k-space phase errors. Such alternative trajectories would be employed in applying the technique described above to other k-space assemblies, such as a spiral assembly or projection reconstruction.

Figure 6:
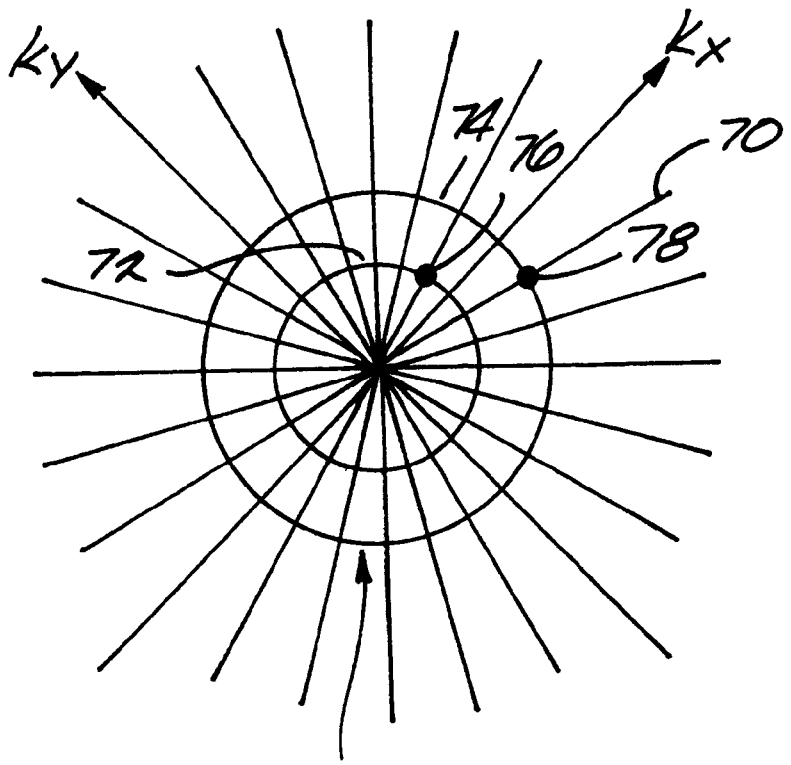
FIG. 6 is a diagram which illustrates an embodiment of the invention in connection with projection reconstruction.

To illustrate application to projection reconstruction, FIG. 6 shows motion-contaminated k-space data, represented by radial lines 70 in regular polar k-space. Acquired correction data samples lie along alignment trajectories 72 and 74, each comprising a circle. Each correction data sample is acquired at a point 76, defined by the intersection of alignment trajectory 72 with an ordinary radial line 70, or at a point 78, defined by the intersection of alignment trajectory 74 therewith.

Obviously, other modifications and variations of the present invention are possible in light of the above teachings. It is therefore to be understood that within the scope of the disclosed concept, the invention may be practiced otherwise than as specifically described.

What is claimed is:

1. A method for providing an MR image of a section taken through an object, wherein said section is acquired in the presence of translational motion of the said object, and said method comprises the steps of:

operating an MR system proximate to said object to acquire a set of imaging data points with respect to said section and with respect to a phase-encoding axis, said imaging data points being acquired at sample points in k-space and being contaminated by phase errors resulting from said motion;

operating said MR system to acquire a plurality of correction data point sets, each data point of a correction data point set being acquired along an alignment trajectory and at a location coinciding with the location of one of said imaging data points, each of said alignment trajectories comprising an alignment line oriented in parallel relationship with said phase-encoding axis, the imaging data points respectively coinciding with the correction data points comprising, collectively, a subset of said imaging data points;

determining the phase difference between each correction data point set and its corresponding subset of imaging data points, each of said phase differences resulting from said phase errors; and employing at least some of said phase differences to remove said phase errors from said set of imaging data points.

2. The method of claim 1 wherein:

each of said imaging data points is acquired at a location which is uniquely identified in k-space with respect to said phase-encoding axis and to a frequency-encoding axis orthogonal thereto.

3. The method of claim 2 wherein:

there are two of said alignment lines, each associated with a correction data point set.

4. The method of claim 3 wherein:

each of said alignment lines is positioned proximate to the center of k-space.

5. The method of claim 2 wherein:

there are in excess of two of said alignment lines, each associated with a correction data point set.

6. The method of claim 5 wherein:

said step of employing phase differences to remove phase errors does not make use of a phase difference computed from a set of correction data points having a k-space magnitude which is less than a threshold determined by an associated noise level.

7. The method of claim 2 wherein:

said step of employing phase differences to remove phase errors comprises determining values of $\Delta x_n$ and $\Delta y_n$, which comprise spatial displacements for the nth view resulting from said phase errors, along said frequency-encoding and said phase-encoding axes, respectively.

8. The method of claim 7 wherein:

said MR system is operated to implement a spin echo technique to acquire said imaging data points.

9. The method of claim 7 wherein:

said MR system is operated to implement a fast spin echo technique to acquire said imaging data points, said technique including generation of a given train of echoes, each of said echoes sampling a different k-space region.

10. The method of claim 9 wherein:

values of $\Delta x_n$ and $\Delta y_n$ are determined in connection with one of said echoes, and employed in phase error correction for the k-space regions respectively sampled by the other echoes of said given train.

11. The method of claim 1 wherein:

said imaging data points are acquired in connection with a projection reconstruction k-space trajectory; and said correction data points are acquired along concentric alignment trajectories.

12. A method for providing an MR image of a section taken through an object, wherein said section is acquired in the presence of translational motion of the object, and said method comprises the steps of:

operating an MR system proximate to said object to acquire a set of imaging data points with respect to said section, said imaging data points being acquired at sample points in k-space and being contaminated by phase errors resulting from said motion;

operating said MR system to acquire a plurality of correction data point sets, each data point of a correction data point set being acquired along an alignment trajectory and at a location coinciding with the location of one of said imaging data points, the imaging data points respectively coinciding with the correction data points comprising, collectively, a subset of said imaging data points;

computing the phase difference between each correction data point set and its corresponding subset of imaging data points, each of said phase difference computations being performed in k-space, each of said phase differences resulting from said phase errors; and employing at least some of said phase differences to remove said phase errors from said set of imaging data points.

13. The method of claim 12 wherein:

each of said correction data points is acquired in the presence of a phase-encoding gradient.

14. The method of claim 13 wherein:

said MR system is operated to implement a spin echo technique to acquire said imaging data points.

15. The method of claim 13 wherein:

said MR system is operated to implement a fast spin echo technique to acquire said imaging data points, said technique including generation of a given train of echoes, each of said echoes sampling a different k-space region.

16. The method of claim 13 wherein:

said imaging data points are acquired in connection with a projection reconstruction k-space trajectory; and said correction data points are acquired along concentric alignment trajectories.

* * * * *